United States Patent [19]

Frankeny et al.

[11] Patent Number: 5,037,311

[45] Date of Patent: Aug. 6, 1991

[54] HIGH DENSITY INTERCONNECT STRIP

[75] Inventors: Jerome A. Frankeny, Taylor; Richard F. Frankeny, Elgin; Javad Haj-Ali-Ahmadi; Karl Hermann, both of Austin; Ronald L. Imken, Round Rock, all of Tex.

[73] Assignee: International Business Machines Corporation, Armonk, N.Y.

[21] Appl. No.: 347,695

[22] Filed: May 5, 1989

[51] Int. Cl.⁵ .............................................. H01R 9/09
[52] U.S. Cl. .................................... 439/66; 439/74; 439/95; 439/591
[58] Field of Search ................... 439/66, 74, 88, 91, 439/95, 591

[56] References Cited

U.S. PATENT DOCUMENTS

| | | | |
|---|---|---|---|
| 3,954,317 | 5/1976 | Gilissen et al. | 339/17 E |
| 4,027,936 | 6/1977 | Nemoto et al. | 439/91 |
| 4,752,231 | 6/1988 | Olsson | 439/66 |
| 4,793,814 | 12/1988 | Zifcak et al. | 439/66 |
| 4,806,104 | 2/1989 | Cabourne | 439/66 |
| 4,871,316 | 10/1989 | Herrell et al. | 439/66 |

FOREIGN PATENT DOCUMENTS

| | | |
|---|---|---|
| 0204435 | 5/1986 | European Pat. Off. |
| 2234961 | 4/1973 | Fed. Rep. of Germany ........ 430/66 |
| 2575336 | 12/1984 | France . |

OTHER PUBLICATIONS

S. Byars, "Buckling", Engineering Mechanics of Deformation Bodies, 2nd edition, 1969, Chapter 11, 17 pages.
T. A. Anzalone, "High Density Double Contact Zero Insertion Force Connector", IBM TDB, vol. 17, No. 2, 7/74, pp. 440-441.
"Elastomeric Connector Application Guide", PCK Elastomerics, Inc.

Primary Examiner—Paula A. Bradley
Attorney, Agent, or Firm—Robert M. Carwell

[57] ABSTRACT

An interconnect strip is provided for effecting electrical interconnection between pluralities of conductor pads disposed on circuit boards or the like in a high density configuration. The strip is fabricated from a polymer film carrier having laminated thereon a metal foil with preselected spring properties. After lamination, lithographic techniques from a series of electrically isolated metallic beams on the carrier. Additional chemical processing removes portions of the carrier at opposing sides of the strip to expose opposing ends of the beams which extend beyond the carrier parallel to one another in opposing directions outwards from the carrier. By urging the pads towards respective beam ends of the strip disposed between the pads until mating engagement therewith, a plurality of electrical interconnections are established through the beams. Flexural properties of the strip provide a low insertion force connection for a high density of conductors wherein the spring action of the strip assures favorable contact forces to the pads. The exposed film side of the strip may also be metalized and provided with beams or interconnected to beams on opposing side of the film by vias thereby providing a ground plane.

5 Claims, 5 Drawing Sheets

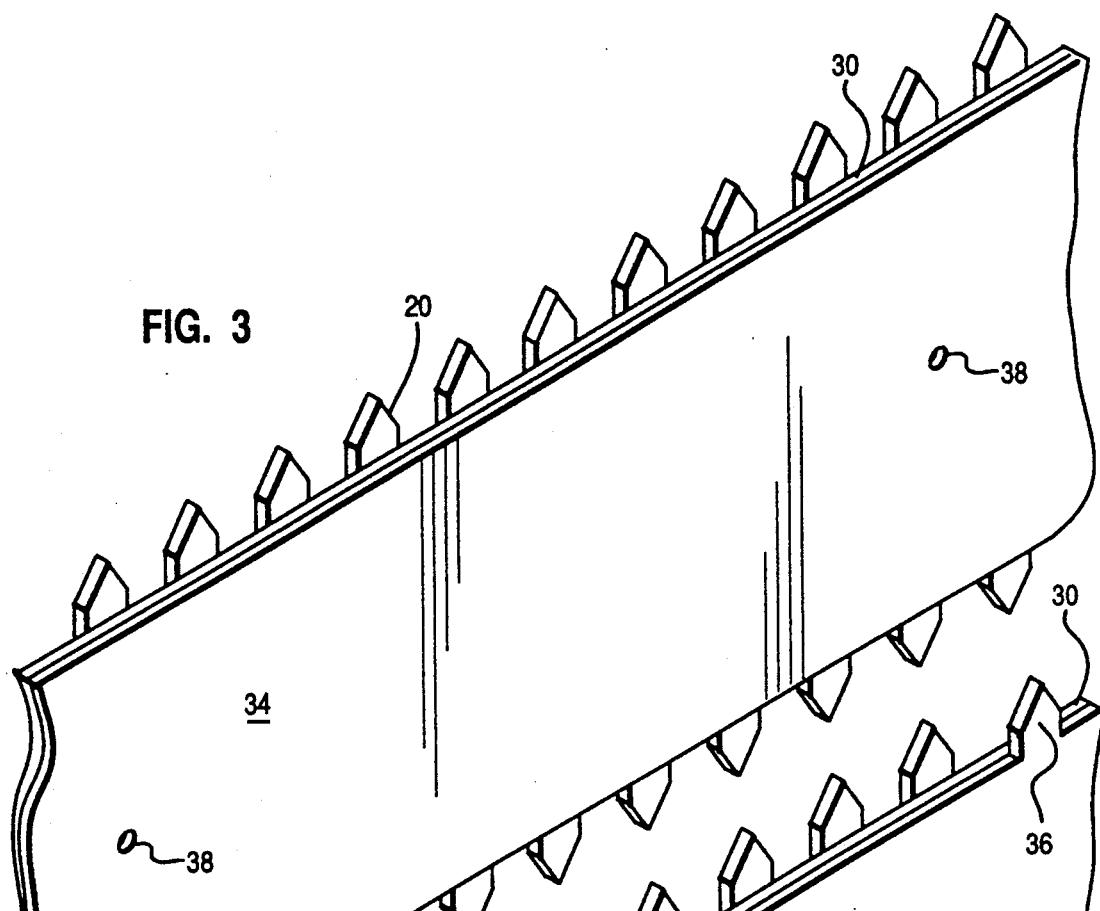

HIGH DENSITY INTERCONNECT STRIP

TECHNICAL FIELD

This invention relates to electrical connectors and, more particularly, relates to such connectors for use in the interconnection of high density conductors and methods for manufacture of same.

BACKGROUND ART

As the conductor density has increased with the evolution of the electronic circuit packaging arts, there has been a concomitant ever-increasing need to provide reliable electrical connections between multiple conducting lines on two circuit boards over long distances often in excess of 0.5 inches. A number of factors have been compounded to substantially increase the problems associated with providing these interconnections. The increasingly smaller dimensions of the high density interconnect pads (often having pitches and pad widths less than 0.020 inches and 0.010 inches, respectively), increasingly higher frequencies associated with the various circuitry to be interconnected (giving rise to signal and noise coupling problems with the interconnections and the associated difficulty in controlling impedances between the boards at the interconnections) are but a few of these factors. Moreover, due to the widely varying dimensions associated with contact pads and their spacing, it further became highly desirable to provide a universal connector readily adaptable to these variations to avoid the necessity to customize either the connector or the interconnect pad dimensions. Yet an additional problem in providing such interconnections also related to these increasingly smaller dimensions of the interconnect points. Due to the resultant susceptibility of these very small and some times delicate interconnect points to damage arising from the forces encountered in effecting interconnections, it became highly desirable to provide connector systems in which these forces were minimized, giving rise to zero insertion force connectors.

One approach in the art has been to provide for buckling beam type connections, the theory of such buckling being discussed in "Engineering Mechanics of Deformation Bodies", second edition 1969, Chapter 11, by Snyder Byars, which is incorporated by reference herein. Essentially the approach involved providing a very thin buckled wire member whose ends served as contact points to the two pads to be interconnected. By aligning the pads in vertical registry with the longitudinal axis of the beam and thence urging these contact pads toward respective ends of the beam until they matingly engaged therewith, the desired contact was made between the pads. The buckling properties of the beam were such that a relatively low and constant forces was exerted axially outwards at both ends of the beam toward the pads. Interconnections with good electrical integrity were thereby effected wherein these forces were relatively constant independent of the degree of axially inward compression exerted on the beam by the contact pads at either end.

Whereas this approach did provide for interconnection of relatively minute contact pads and further provided a substantial reduction in the forces which must be withstood by the pads and associated carriers during the act of effecting the connection, several serious problems nevertheless remained with this approach. First, the buckling beams typically were in the form of extremely thin whisker-like wires creating extremely difficult mechanical problems to overcome in fabricating a connector. The wires difficult to machine and manufacture, including problems controlling the dimensions thereof and other parameters including their spring properties, sharpness of the exposed beam ends for effecting good pad contact, characteristic impedance and the like. Numerous other problems were found to exist such as the need to package the beam so as to maintain proper orientation relative to the pads at all times and to do so with a minimum of complexity.

The problems associated with providing such a high density connector employing the buckling beam principle may be readily appreciated with reference to the article "High Density Double Contact Zero Insertion Force Connector", *IBM Technical Disclosure Bulletin*, Vol. 17, No. 2, July 1974 by Anzalone, et al, wherein there is disclosed an extremely mechanically complex connector employing a plurality of buckling beams. Not surprisingly, due to the aforementioned problems associated with buckling beam technology and the attendant costs, this approach more typically found application in single wire test probes or other test equipment wherein a small number of connections were required.

It is true that buckling beam technology was also employed in bed-of-nails testers and other equipment wherein numerous connections were desired. However such multiple buckling beam applications typically required interconnections to apparatus under test of only a temporary nature. Due to the high connector cost and complexity, they were not intended for the electronic packaging arts in general wherein numerous permanent interconnections were desired to be provided by a low cost connector for use on a mass scale (as in consumer electronics for example).

In an effort to provide the benefits of a buckling beam type connection while at the same time avoiding some of the hereinbefore noted drawbacks, yet another form of connector was developed for application with high density conductors known generally as elastomeric or polymetric connectors such as those manufactured by the PCK Elastometrics, Inc. Company, a unit of the Kollmorgen Corporation, 2940 Turnpike Drive, Hatboro, Penn. These connectors are typically made of a conductive silicone rubber or metal conductor supported by insulating silicone rubber bodies in a sandwiched fashion. Sections of the conductive material are alternated with sections of the insulating material sequentially so as to form a resilient strip. By sandwiching the elastomeric connector element under moderate pressure between two substrates, boards, or the like which carry conductive pads to be interconnected, interconnection is effected between preselected pads on the first and second substrates through the particular conductive sandwiched layers disposed between the pads. The interconnection thereby established is electrically isolated from adjacent such pad pairs by the sandwiched layers formed by the insulative material.

Numerous beneficial properties are provided by such elastomeric connectors over those offered by the buckling beam connectors of the prior art. They are of a relatively simple mechanical configuration resulting in ease of manufacture and suitability for high density applications wherein traces as fine as 0.001 inches with a pitch of 0.002 can be positioned on the elastomeric base. This provides opportunity for redundancy of interconnection between conductive pad pairs through a plurality of the conductive layers of the elastomeric strip. Moreover various other parameters associated with the connectors may be readily controlled to a relatively high degree of accuracy.

Nevertheless, notwithstanding the distinct improvement in many ways offered by this technology over the buckling beam approach, many extremely serious problems and limitations remained with these types of connectors.

One such deficiency with the elastomeric connectors is that the conductive surfaces thereof are typically relatively flat and blunt. The penetrating function associated with the pointed tips of the fine wires of the buckling beams is thus not available for effecting a more reliable gas tight seal with the contact pads. This sealing action is less susceptible to corrosion due to the wiping action of the buckling beam tips, and is not experienced in the elastomeric connectors. Moreover, with respect to the later it has been found that it is frequently more difficult in a given application to provide for a desired constant forcing function over time and variable distances over which the connector must be compressed to effect the interconnections. In other words, with respect to such polymetric connectors it has been found that their spring constant curve varies undesirably not only over time but as a function of the amount of deflection they must be subjected to during the connecting process.

Still further, no provision is made in either the buckling beam or elastomeric connector types of the prior art to facilitate multiple circuit layers in a direction normal to the longitudinal axis of the connector. For example, often times it is desirable to provide for a ground plane layer between the contact pads of the first and second boards to avoid aforementioned noise coupling problems between boards and the like. However the buckling beam and elastomeric connectors previously known did not readily provide facility for implementing ground planes for reducing this problem to manageable proportion.

These and other deficiencies of the connectors of the prior art adapted to high density conductors are overcome by the present invention. There is provided a connector which is of a simple mechanical construction that is easy and inexpensive to manufacture and highly versatile in providing opportunity to finely control numerous parameters associated with the conductive strip (including the geometric properties of each beam to a high degree of precision such as lengths, widths, tip sharpness and spacing). Moreover additional flexibility is provided by multiple conductive layers in a direction normal to the longitudinal axis of the conductor whereby, for example the aforementioned ground plane may be included to effect improved noise performance of the connector. These and other benefits of the present invention are provided.

SUMMARY OF THE INVENTION

An interconnect strip is provided for effecting electrical interconnection between pluralities of conductor pads disposed in opposing relation on circuit boards or the like in a high density configuration. The strip is fabricated from a polymer film carrier having laminated thereon a metal foil with preselected spring properties. After lamination, lithographic techniques form a series of electrically isolated parallel metallic beams on the carrier. Additional chemical processing removes portions of the carrier along opposing sides of the strip so as to expose opposing ends of the beams which extend beyond the carrier parallel to one another in opposing directions outwards from the carrier.

By aligning a strip relative to the boards whereby pads on one board are adjacent the exposed beam ends along one edge of the strip and with pads of the remaining board in line adjacent the exposed beam ends along the remaining edge of the strip, and by thence urging the first and second pluralities of pads towards their respective beam ends until mating engagement therewith, a plurality of electrical interconnections are established through the beams. Each such connection is comprised of one or more of the first and second pluralities of pads and one or more of the beams. Flexural properties of the strip provide a low insertion force connection for a high density of conductors wherein the spring action of the strip assures favorable contact forces to the pads. The exposed film side of the strip may also be metalized and also may be provided with beams or interconnected to beams on opposing side of the film by vias thereby providing a ground plane or other circuitizing on the connector as required.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

FIG. 3 is a pictorial illustration of an alternate embodiment of the interconnect strip of FIG. 2;

FIG. 4 is a pictorial illustration of yet another alternate embodiment of the interconnect strip of FIG. 2;

DETAILED DESCRIPTION OF THE PREFERRED EMBODIMENT

First the general purpose, operation, and construction of the invention will be described with reference to the schematic illustration of FIG. 1. This will be followed by a more detailed description of the invention with reference to FIG. 2, followed by description of various embodiments thereof with reference to FIGS. 3-7. An explanation of the method of construction of the interconnect strip of the present invention will then be provided.

Figure 1:
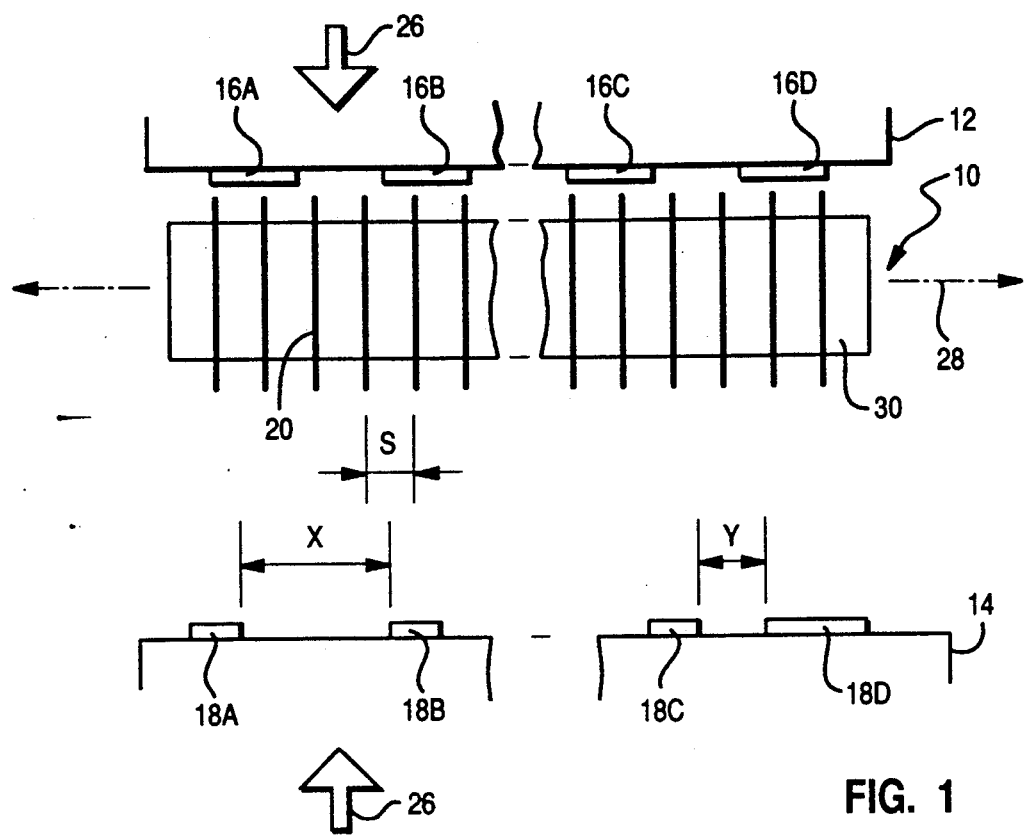
FIG. 1 is a schematic illustration of the operation of the present invention in a sectioned elevational view of the connector strip.

With reference first to FIG. 1, the invention is depicted therein generally as interconnect strip 10 which is a universal connector adapted to be disposed between two circuit boards 12 and 14 in order to provide interconnection between contact pads 16a–16d disposed on board 12 and corresponding ones of a plurality of connector pads 18a–18d disposed on board 14. It will be noted that the connector pads of a given board may be of variable horizontal spacing, such as distance X shown with respect to pads 18a-18b and distance Y between pads 18c and 18d. The general purpose of the universal connector strip 10 is to provide a universal means for effecting electrical interconnection as, for example, between the aforementioned pad 16a, board 12, and correlative pad 18a, board 14 while compensating for the aforementioned dimensional variations. More particularly, the desired interconnections are effected notwithstanding the noted variable horizontal spacings between the pads of the boards, slight horizontal misalignments between boards 12, 14, and without the need for precise alignment of the strip 10 relative to the pads 16-18.

In accordance with the invention, a carrier means 30 is provided of an insulating material which may elastomeric if desired to conform to various physical spacings, contours, and pressure between the two boards 12 and 14. Each connector 10 is provided with a plurality of conductor lines or beams 20, each being in the form of a thin conductive filament or wire. Upon application of force whereby the boards are urged together in the direction of arrows 26 during makeup of the connector, the boards 12, 14 and the connector 10 will form an integral unit effecting the desired electrical interconnections. The horizontal spacing between adjacent distal ends of each beam 20 is sufficiently close so as to insure that for a given horizontal spacing of the pads 16, 18 and variable vertical registry thereof, it is insured that at least one beam 20 contacts preselected mating pairs of contacts such as 16a-18a, or 16c-18c between which the interconnection is desired, so as to complete an electrical pathway between the contact pairs. It is desirable to provide for sufficiently small spacing between the beams 20 in the longitudinal direction 28 of the strip 10 so that redundant interconnection between a given pad pair is effected by two or more such beams.

Figure 2:
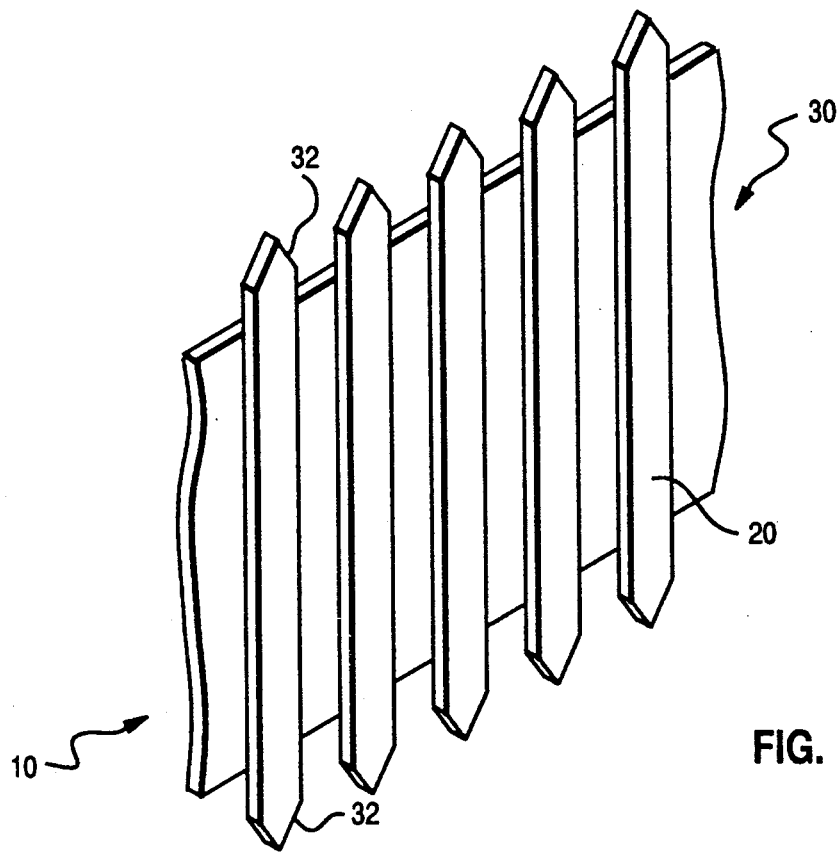
FIG. 2 is a pictorial illustration of a representative interconnect strip of the present invention.

With reference now to FIG. 2, a pictorial view of the thin high density interconnect strip 10 is shown, in which the previously described beams 20, in addition to serving as conductors between pad pairs, also serve the additional function as springs to assure high contact forces between the interconnected pads. The strip 10 is preferably fabricated from a metal foil with good spring properties, such as beryllium-copper, and a polymer film carrier such as a polyimide. After lamination of these two materials, standard lithographic techniques are employed to pattern the series of beams 20 of metal on the polymer carrier 30 as shown in FIG. 2. Additional chemical processing is used to remove a portion of the polymer carrier under the ends 32 of the metal beams. The resulting structure accordingly consists of the polymer carrier 30 strip supporting beams 20 which, after the manufacturing process just described, provide opposing pointed ends 32 extending axially in opposing directions along the longitudinal axis of the respective beams 20. These metallic beams 20 may be additionally metalized as desired for improved resistance to corrosion or more reliable electrical contact as required.

As shown in FIG. 3, an additional feature of this invention is the provision for circuitizing the backside of the polymer carrier 30, with a conductor and further providing for electrical interconnection to selected ones of the beams 20 as desired by the inclusion of via interconnects 38 extending through this metallic layer 34. The advantage of providing for such a conductive layer 34 interconnected to selected ones of the beams 20 include the ability to permit this layer 34 to serve the purpose of an electrical ground plane to be disposed between the boards 12, 14 and interconnected to ground potential on one or more of these boards as desired, thereby improving the noise characteristics of the resultant package.

In FIG. 4 an alternate embodiment of the connector strip 10 of the invention is illustrated similar to that of FIG. 3 with a few notable exceptions. Again, etched interconnect beams 20 are provided on one side of the insulative carrier 30 and an etched solid ground plane 34 on the remaining side of the carrier 30. However, unlike the embodiment depicted in FIG. 3, electrical contact to the ground plane 34 side is made by etching beam tips 36 at prescribed locations for contacting ground plane pads on the board 12 and/or board 14 as desired. Thus, this embodiment differs from that of FIG. 3 wherein the interconnections to the ground plane pads on the boards 12, 14, it will be recalled, were affected by means of the conductive vias 38 electrically connecting the ground plane 34 with desired preselected ones of the beams 20. An additional feature of the embodiments depicted in FIGS. 3 and 4 by the addition of the ground plane 34 is that this ground plane may provide additional spring properties for the laminate as desired which may be controlled by preselection of the materials of the laminate layers and thicknesses.

Figure 5:
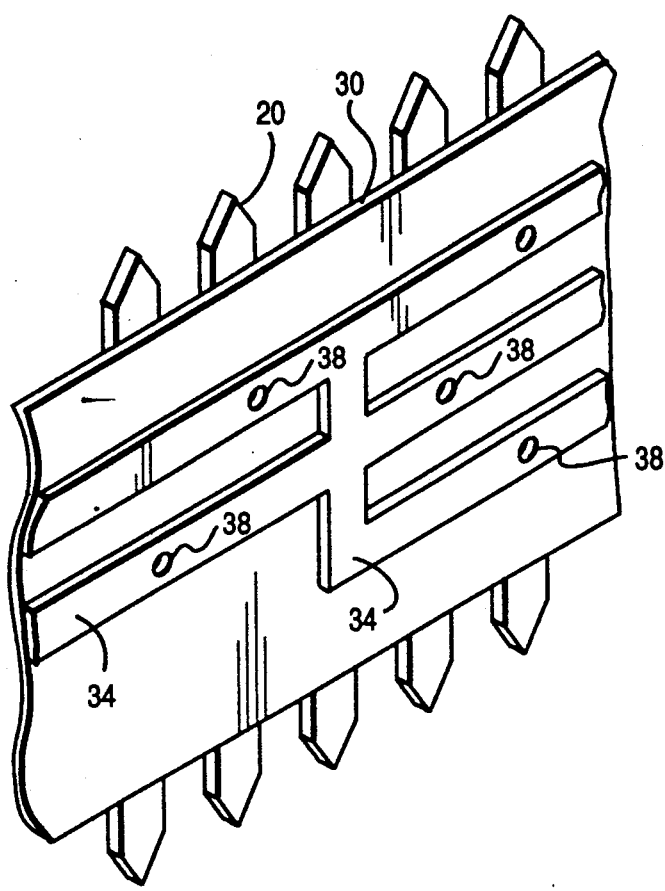
FIG. 5 is a pictorial view of another alternate embodiment of the interconnect strip of FIG. 2.

In FIG. 5 an alternate embodiment of the connector strip 10 of FIG. 3 is shown. This embodiment is intended to illustrate that the invention contemplates that the polymer carrier 30 may be circuitized in any desired manner as contrasted to the metallic layer 34 of FIG. 3 which serves primarily as a ground plane. Thus, in contrast, the metallic layers 34 shown in FIG. 4 may be etched or otherwise formed into any desired conductive patterns 34A, 34B, etc. Each pattern may be electrically isolated from one another and connected to desired ones of the beams 20 through appropriate positioning of vias 38 thereby providing electrical interconnections as desired to any pads on board 12 and/or 14 or to other metallic layer 34 circuits on the carrier 30.

Figure 8:
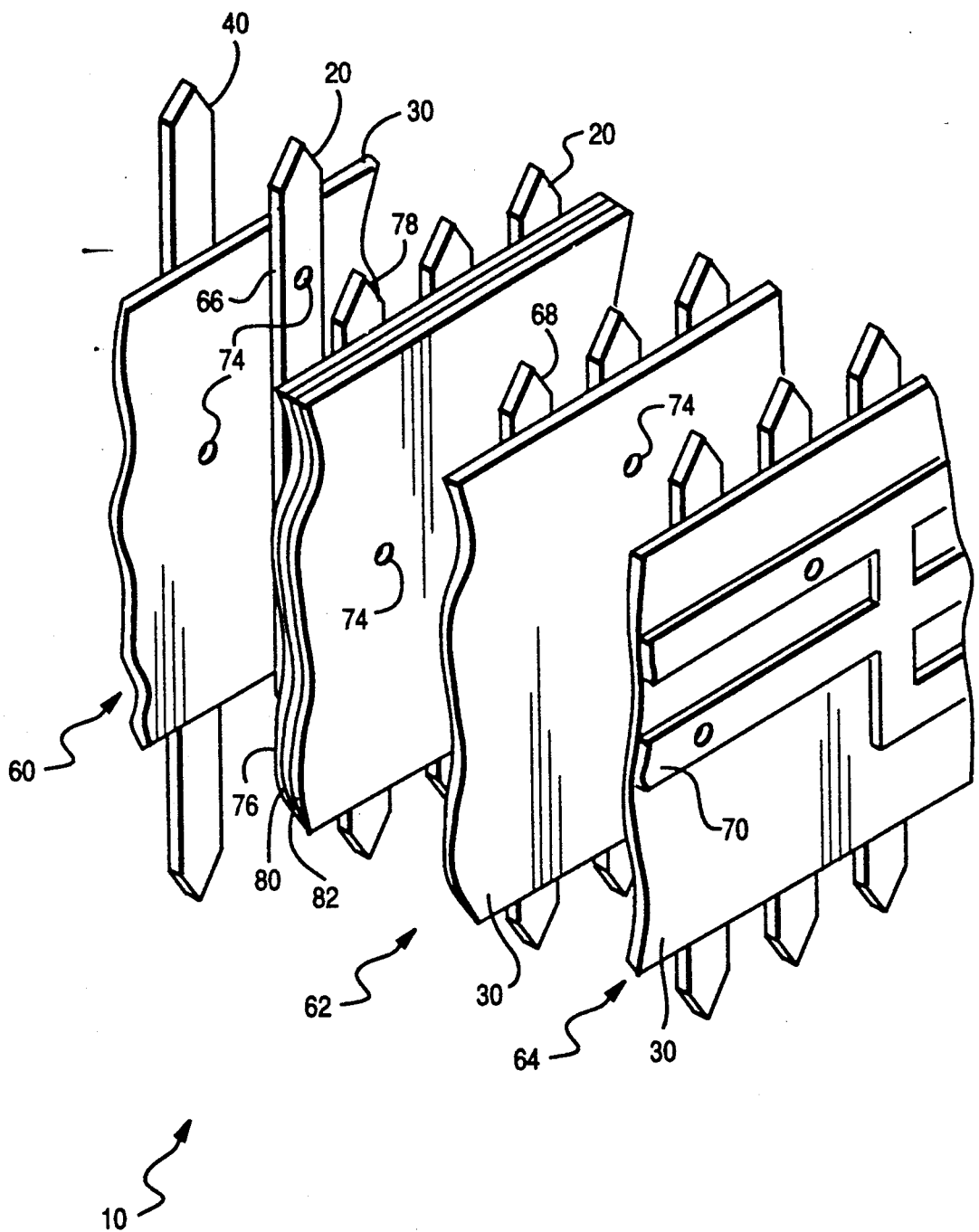
FIG. 8 is another alternate embodiment of the interconnect strip depicted in FIG. 2.

As may be seen in greater detail with reference to the alternate embodiment of FIG. 8, this concept of circuitizing the carrier 30 may be extended to a further level of complexity wherein the connector 10 is even further multi-layered. More particularly, multiple layers of carrier 30 films each carrying a desired circuit pattern interconnected to desired ones of the beams 20 or each other may be provided. These circuitized carriers 30 may be stacked in a sandwiched fashion with each carrier 30 providing insulation from the conductive circuitizing on the next layer, and with each circuitized pattern interconnected to those carried by adjacent carrier layers or the beams as desired. It should be readily apparent that the manner in which the circuits as shown in FIG. 5 are constructed is preferably similar to the way in which the beams 20 are formed, i.e., by first providing a conductive laminate layer as shown in FIG. 3 and thereafter etching the desired patterns as shown in FIG. 5 by lithography processes or the like well known in the art.

Figure 6:
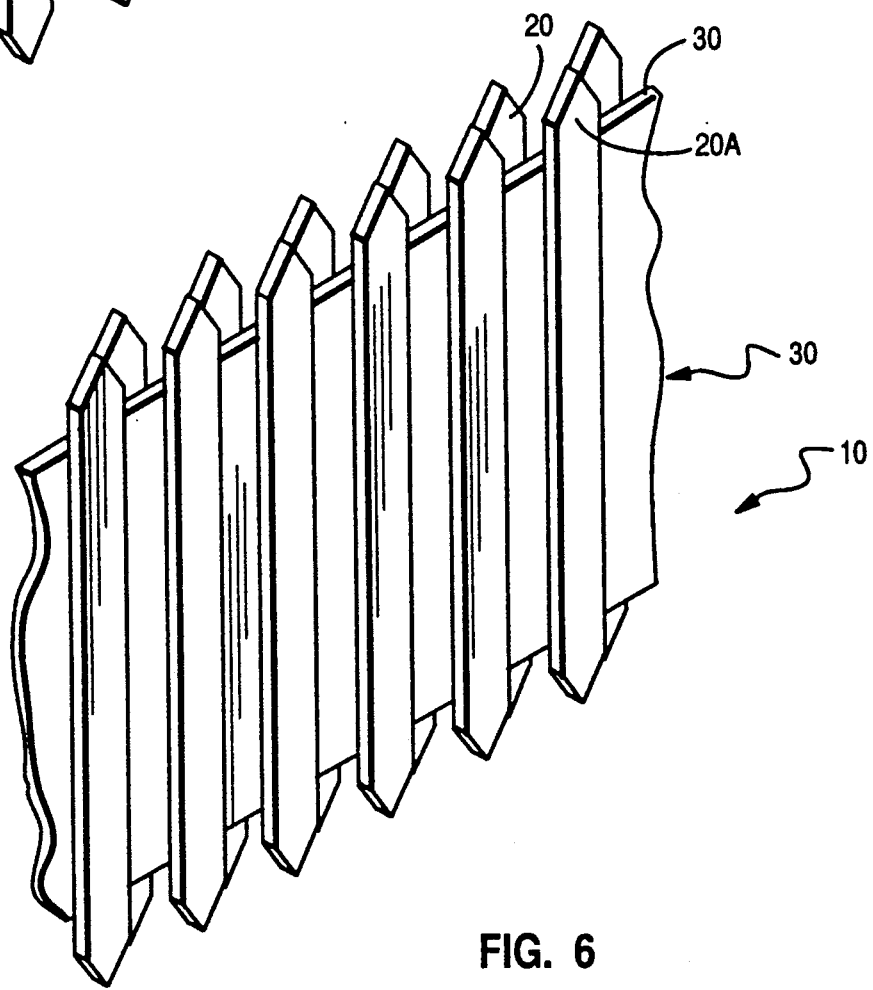
FIG. 6 is another pictorial view of yet an additional alternate embodiment of the interconnect strip depicted in FIG. 2.

With reference to FIG. 6, yet an additional embodiment is illustrated of the connector strip 10 with metal beams 20 and 20A having the appropriate desired spring properties etched on both sides of the polymer carrier 30. As shown the beams are offset in the longitudinal direction of the strip 10 normal to the longitudinal axes of the beams 20 and 20A in order to provide a higher density of interconnects than could otherwise be achieved with beams only on one side of the carrier 20. Additionally, if desired the beams 20a could be aligned on top of beams 20 in opposed registration. In any event the additional beams 20a being carried on the opposing side of the carrier 30 will be recognized as providing redundancy in contacting the same conductive pads carried by the boards 12, 14.

Figure 7:
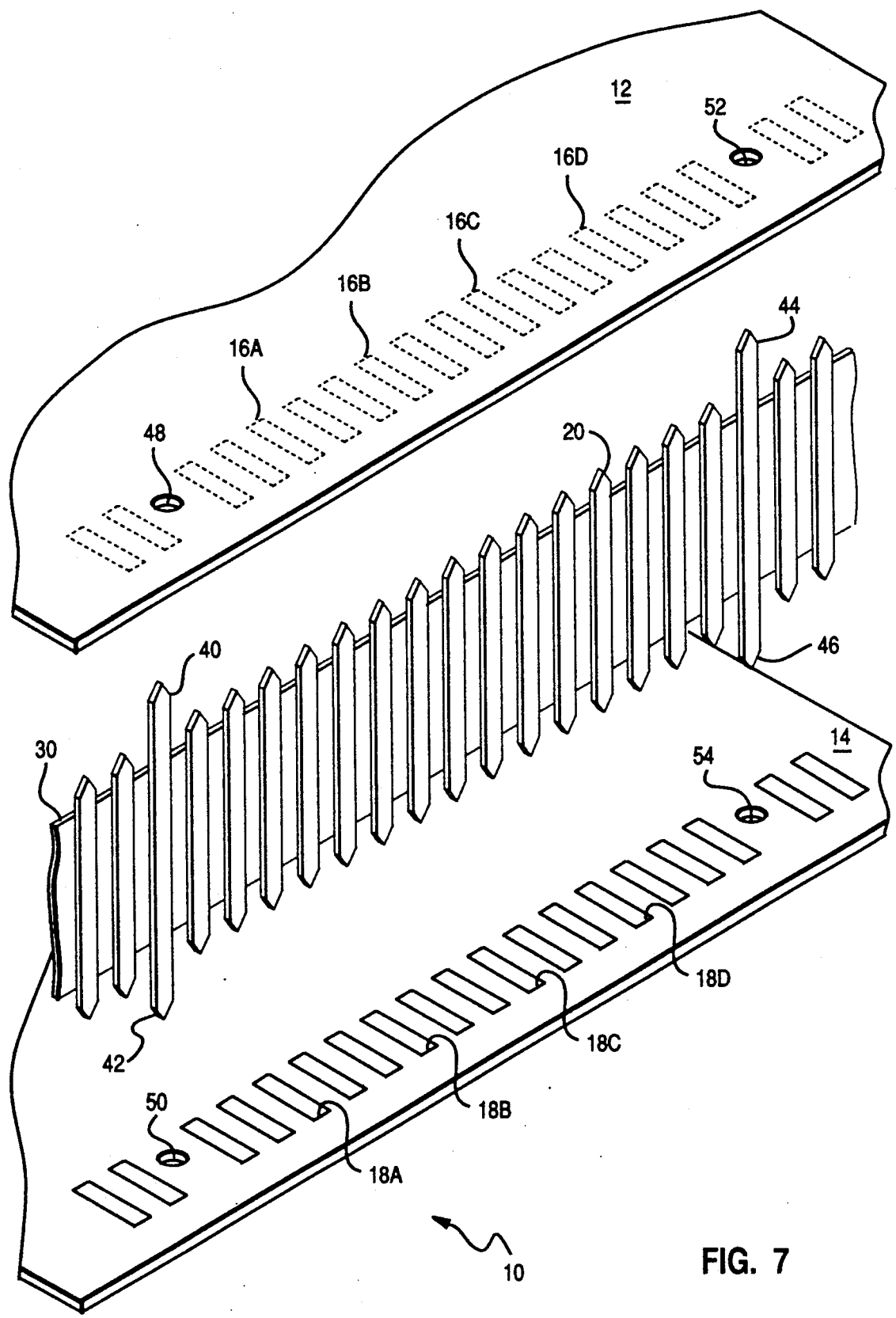
FIG. 7 is another alternate embodiment of the interconnect strip depicted in FIG. 2.

Referring now to FIG. 7 still another alternate embodiment of the invention is depicted therein which provides a method for automatically locating the beams 20 to their desired pads. In some applications of the invention location of the beam tips to their respective appropriate pads may be difficult considering the fragility of the interconnect strip and the small pad and beam sizes involved in modern high density packaging. The embodiment depicted in FIG. 7 is intended to address this problem. It will be noted from FIG. 7 that certain of the beams may desirably be etched to extend in opposing longitudinal directions further than those of adjacent beams, as shown at reference numerals 40, 42, 44, and 46. From a close examination of boards 12 and 14, it will be noted that registration holes 48, 50, 52 and 54 are provided spaced longitudinally along the edges of their respective boards to correspond to the longitudinal distance separating the longer beam tips 40-44 and 42-46. The purpose of these holes is to aid the elongated beams in serving as location devices wherein the elongated beam tips 40, 42, 44 and 46 would locate in mating holes 48, 50, 52 and 54, thereby assuring that the conductor beams 20 would locate centrally to the pads such as 16a-16d and 18a-18d, further additionally preventing vibration of beams off of their respective pads during handling or operation. If necessary, the beams having these elongate tips could be of a different and generally greater width of those of the conductor beams intended for effecting interconnection between pads if more mechanical strength was desired.

With respect to the embodiment of FIG. 7, it will readily be appreciated that typically two more elongated beams 20 might be used, one at each end of the strip 10. However, the invention is not so limited and in some applications a single beam might be used provided that other means were available to maintain the linearity of this strip in the longitudinal direction along the pads. If desired, additional more elongate locator beams could be used at regular intervals for additional placement accuracy of beams on the pads or when a longer strip connector 10 was required. Although the primary function of such elongate beams is thus for location, they may also serve an electrical interconnection function between pads on the boards 12, 14 if desired. It should be readily apparent that tolerances between the locator beams and the mating holes would be selected as necessary to accommodate mismatches of thermal expansion properties of the substrates of the boards 12, 14 as well as that of the strip 10 as required. It will be noted that these elongate beams may also be formed in the identical manner by which the shorter beams 20 are formed, by lithographic or other processes well known in the art. In this manner, the modification could be effected involving only the nominal additional cost of the location holes 48-54 in the substrates to be joined.

As alluded to in the discussion of FIG. 5, the invention also contemplates multi-layer structures as shown in FIG. 8 involving multiple layers such as 60, 62, 64 each comprised of an insulative carrier layer 30 and a conductive layer such as 66, 68 and 70, with the patterns of the conductive layers being formed in the aforementioned manner by a lithographic-etching process or the like. The geometric shapes of the conductive portions of each layer may be as desired and may include a previously described beams 20 (including locating beams 40, ground planes as shown generally by the conductive layer 68 of the inner layer 62 in a manner similar to that of the embodiment of FIG. 4). The shapes may further even include circuitized conductive patterns on one or more of the layers such as the conductive patterns 70 shown on the outer layer 64 in the manner of the embodiment of FIG. 5. Moreover, the conductive portions of each of these layers 60-64 of the multi-layer embodiment of FIG. 8 may be interconnected electrically as required by means of vias in the manner previously described as shown generally by vias 74 in FIG. 8. It may also be desirable in some applications to include one or more buried ground planes which may be provided internally or as one of the outer layers and may be comprised of a triple layer laminate, for example, consisting of polymer dielectric layers 76, 82 having disposed therebetween a metal foil layer 80 or the like thereby providing effective ground plane properties to the connector strip 10.

It should be noted that pads 16a-16d, 18a-18d may be of any desired number and spacing as required, and that they provide convenient contact points for circuitized lines, components, and the like (not shown) carried on their respective boards 12, 14 and connected to these pads. However, the invention is not intended to be limited to use only with pads as the term is used in a conventional sense. Rather, the term pads is intended to include first and second sets of any electrically conductive areas facing inwardly towards each other in opposing relation wherein it is desired to electrically connect any of these pads to other such pads.

Moreover, although the carriers upon which these pads have been disposed are referred to as boards, it should also be readily understood that the use of the invention is of a more general nature encompassing a wide variety of types of carriers of these conductive areas which are to be electrically interconnected. It is therefore not intended to limit the invention to conventional circuit boards such as a particular type of peripheral adapter card or the like. Rather the invention contemplates use with any other type of carrier of pads or combinations thereof as required by the particular application or desired electronic package wherein the plurality of pads may be disposed in opposing relation for interconnection therebetween.

Thus, FIG. 7 shows these pads as being carried by parallel boards, but they may just as easily be carried by opposing ends of boards or connectors, or even a motherboard and a perpendicular peripheral card as is commonly encountered with respect to motherboards and cards interconnected by edge connectors or the like.

A description now follows of the materials, process sequence, equipment and conditions employed in constructing a typical connector strip of the invention. Although this example is for a strip having beams on only one side of the insulator strip, it will be readily appreciated that similar techniques, equipment and materials may be employed to make alternate embodiments of the invention such as those hereinbefore described such as multilayer strips, by employing techniques well known in the art including lamination, photoresist application, exposure, developer, etchant, stripper steps and the like.

| Materials | |
|---|---|
| Conductive Material Layer: | Beryllium copper strip Brush-Wellman 190 Alloy (Copper alloy UNS Number C17200), .002" thickness 1.80–2.00% Be 0.20% minimum Co + Ni 0.6% maximum Co + Ni + Fe XHMS Temper |
| Insulative Carrier Strip: | Polymer carrier strip Dupont Pyralux LF0110 .001" Kapton Polyimide .001" Pyralux Acrylic Adhesive |
| Photoresist: | Dupont Riston 3315 .0015" thickness |
| Developer: | Sodium carbonate solution |
| Etchant: | Cupric Chloride/Hydrochloric Acid solution; Ferric Chloride/Hydrochloric Acid solution; or Sodium Persulfate/Sulfuric Acid solution |
| Stripper: | Sodium Hydroxide solution |

Process Sequence

First the beryllium copper strip is laminated to the polymer carrier by means of a compression press operating at 370° F. for 40 minutes at 400 psi. After such lamination, the exposed beryllium copper surface is preferably rinsed by hand or a machine abrade and rinsed, whereupon the photoresist is applied to the thus cleansed beryllium copper surface by means of a hot roll laminator or other suitable process.

Suitable art work in the form of a conventional mask of the desired geometric pattern of the conductive beams to be formed is then produced whereupon the photoresist is exposed using this mask in accordance with standard ultraviolet phototool practices. Upon thereafter developing the photoresist on the laminate by means of a sodium carbonate process line, the beryllium copper surface is thereafter etched using a standard copper etch process line and any of a number of etchants such as those hereinabove noted. Next, the remaining photoresist which will exist primarily on the remaining beryllium copper after the etch process is stripped away using a standard caustic strip line employing the hereinabove noted sodium hydroxide solution as a stripper for a like solution. After these process steps, the desired pattern of beryllium copper beams and other circuitizing as desired will be seen to have been formed on the insulative carrier strip, and by means of shearing, scissors, or the like, the desired imaged parts may be excised and clamped in a clamping fixture in preparation for the next step necessary to expose the beam tips so that they may extend beyond the opposing edges of the carrier strip so as to readily contact the pads.

After clamping the excised imaged part, the part and fixture are placed in a plasma etcher which may include a $CF_4/O_2$ gas at 1 torr, with the etching process permitted to transpire for approximately two hours. It will be noted in clamping the imaged part the opposing edges of the insulative carrier strip are permitted to extend outwards of the fixture as well as the beam tips carried thereon but the remainder of the part is protected by the clamping mechanism from exposure to the plasma etcher gas. The purpose for this step is to remove the insulative carrier strip from underneath the outer tips of the beryllium copper beams formed by the etching process so as to expose only beam tips comprised of the beryllium copper. Accordingly, upon completion of the plasma etcher stage, the desired connector strip of the subject invention is thereby created wherein an insulative strip has been formed with a plurality of beryllium copper beams also being formed and carried thereon in a desired pattern. In one embodiment, it will be recalled that this pattern of beams will appear substantially as a plurality of parallel pickets electrically isolated from one another with pointed opposing tips extending in opposing directions outwards from corresponding opposing edges of the insulative strip.

While the invention has been shown and described with reference to particular embodiments thereof, it will be understood by those skilled in the art that the foregoing and other changes in form and details may be made therein without departing from the spirit and scope of the invention.

We claim:

1. A connector for use in establishing interconnections between electrical conductive pads, comprising
   an insulative carrier strip;
   a plurality of conductive spring action beams carried on a first side of said strip; and
   a conductive layer carried on a second side of said strip opposing said first side.

2. The apparatus of claim 1 wherein said conductive layer is a ground plane.

3. The apparatus of claim 1 wherein said beams flex along substantially their entire longitudinal axes between said pads during said establishing of said interconnections.

4. The apparatus of claim 1 wherein said beams provide substantially constant restoring forces against said pads during said interconnections independent of the magnitude of axial compression exerted upon said beams by said pads.

5. A connector for use in electrically interconnecting conductive pads, comprising
   an insulative carrier strip defining longitudinal strip axis; and
   a plurality of conductive beams including at least one locater beam, said beams being carried by said strip and defining a plurality of parallel longitudinal beam axes normal to said strip axis, said beams further including first and second ends extending beyond said strip in opposing directions for contacting corresponding ones of said pads.

* * * * *